United States Patent
Adel et al.

(10) Patent No.: US 9,116,442 B2
(45) Date of Patent: *Aug. 25, 2015

(54) FEEDFORWARD/FEEDBACK LITHO PROCESS CONTROL OF STRESS AND OVERLAY

(75) Inventors: Michael Adel, Zirchron Yaakov (IL); John Fielden, Los Altos, CA (US); Amir Widmann, Sunnyvale, CA (US); John Robinson, Austin, TX (US); Dongsub Choi, Yongin (KR)

(73) Assignee: KLA-Tencor Corporation, San Jose, CA (US)

( * ) Notice: Subject to any disclaimer, the term of this patent is extended or adjusted under 35 U.S.C. 154(b) by 805 days.

This patent is subject to a terminal disclaimer.

(21) Appl. No.: 13/336,370

(22) Filed: Dec. 23, 2011

(65) Prior Publication Data
US 2012/0094400 A1    Apr. 19, 2012

Related U.S. Application Data

(63) Continuation of application No. 12/130,699, filed on May 30, 2008, now Pat. No. 8,111,376.

(60) Provisional application No. 60/940,953, filed on May 30, 2007.

(51) Int. Cl.
*G03F 7/20* (2006.01)

(52) U.S. Cl.
CPC ............ *G03F 7/70258* (2013.01); *G03F 7/705* (2013.01); *G03F 7/70525* (2013.01); *G03F 7/70616* (2013.01); *G03F 7/70783* (2013.01)

(58) Field of Classification Search
CPC . G03F 7/705; G03F 7/70783; G03F 7/70616; G03F 7/70633; G03F 7/7085; G03F 7/70625; G03F 1/44; G03F 1/84; G03F 7/70433; G03F 7/70441; G03F 7/70516; G03F 9/7003
USPC ...................................... 355/52, 53
See application file for complete search history.

(56) References Cited

U.S. PATENT DOCUMENTS

| 4,750,141 A | 6/1988 | Judell et al. |
| 5,134,303 A | 7/1992 | Blach et al. |

(Continued)

FOREIGN PATENT DOCUMENTS

| JP | 9326349 | 12/1997 |
| JP | 2001332609 | 11/2001 |

(Continued)

OTHER PUBLICATIONS

English Language Translation of Japanese Patent Application No. 2004214415, attributed to Hirano et al., published Jul. 29, 2004.

(Continued)

*Primary Examiner* — Mesfin T Asfaw
(74) *Attorney, Agent, or Firm* — Joshua D. Isenberg; JDI Patent

(57) ABSTRACT

A method and apparatus for process control in a lithographic process are described. Metrology may be performed on a substrate either before or after performing a patterning process on the substrate. One or more correctables to the lithographic patterning process may be generated based on the metrology. The patterning process performed on the substrate (or a subsequent substrate) may be adjusted with the correctables.

38 Claims, 3 Drawing Sheets

(56) References Cited

U.S. PATENT DOCUMENTS

| | | | |
|---|---|---|---|
| 5,248,889 | A | 9/1993 | Blach et al. |
| 5,757,673 | A | 5/1998 | Osheiski et al. |
| 5,912,738 | A | 6/1999 | Chason et al. |
| 6,023,338 | A | 2/2000 | Bareket |
| 6,031,611 | A | 2/2000 | Rosakis et al. |
| 6,100,977 | A | 8/2000 | Muller |
| 6,118,185 | A | 9/2000 | Chen et al. |
| 6,130,750 | A | 10/2000 | Ausschnitt et al. |
| 6,442,496 | B1 | 8/2002 | Pasadyn et al. |
| 6,477,432 | B1 | 11/2002 | Chen et al. |
| 6,766,214 | B1 | 7/2004 | Wang et al. |
| 6,847,458 | B2 | 1/2005 | Freischlad et al. |
| 6,859,746 | B1 | 2/2005 | Stirton |
| 6,883,158 | B1 | 4/2005 | Sandstrom et al. |
| 6,912,435 | B2 | 6/2005 | Pellegrinj et al. |
| 6,921,916 | B2 | 7/2005 | Adel et al. |
| 6,985,618 | B2 | 1/2006 | Adel et al. |
| 7,184,853 | B2 | 2/2007 | Roberts et al. |
| 7,398,172 | B2 | 7/2008 | Behm et al. |
| 8,111,376 | B2 | 2/2012 | Adel |
| 8,175,831 | B2 | 5/2012 | Izikson et al. |
| 2003/0204348 | A1 | 10/2003 | Suzuki et al. |
| 2004/0044431 | A1 | 3/2004 | Pellegrini et al. |
| 2004/0121495 | A1 | 6/2004 | Sonderman et al. |
| 2005/0136346 | A1 | 6/2005 | Ottens et al. |
| 2005/0243294 | A1 | 11/2005 | Smith et al. |
| 2005/0278126 | A1 | 12/2005 | Rosakis et al. |
| 2006/0038980 | A1 | 2/2006 | Naka et al. |
| 2006/0114436 | A1 | 6/2006 | Oesterholt et al. |
| 2006/0195215 | A1 | 8/2006 | Suzuki et al. |
| 2006/0265686 | A1 | 11/2006 | Ikeda |
| 2006/0273266 | A1 | 12/2006 | Preil et al. |
| 2007/0021860 | A1 | 1/2007 | Gertrudus Simons et al. |
| 2007/0212856 | A1 | 9/2007 | Owen |

FOREIGN PATENT DOCUMENTS

| | | | |
|---|---|---|---|
| JP | 2004031929 | A | 1/2004 |
| JP | 2004214415 | A | 7/2004 |
| JP | 2005191569 | | 7/2005 |
| JP | 2005233928 | | 9/2005 |
| JP | 2006515114 | A | 5/2006 |
| JP | 2006157014 | | 6/2006 |
| JP | 2006278767 | | 10/2006 |
| JP | 2006286747 | A | 10/2006 |
| JP | 2007027721 | | 2/2007 |
| JP | 2007535170 | | 11/2007 |
| JP | 2009529785 | | 8/2009 |
| WO | WO2004061938 | | 7/2004 |
| WO | 2004095154 | A | 11/2004 |
| WO | 2007006085 | | 1/2007 |

OTHER PUBLICATIONS

Final Office Action for U.S. Appl. No. 12/107,346, dated Aug. 12, 2010.

G.G. Stoney, "The Tension of Metallic Films Deposited by Electrolysis" (1909), Proc. Roy. Soc., p. 172.

International Search Report and Written Opinion for PCT/US2008/061299 mailed on Oct. 10, 2008.

Kuo et al. "Adaptive Sampling for Effective Mult-layer Defect Monitoring," Semiconductor Mfg. Conf. Proc., 1997 IEEE Int'l Symposium, pp. D-01.

Non-Final Office Action for U.S. Appl. No. 12/107,346, dated Apr. 5, 2010.

Notice of Allowance for U.S. Appl. No. 12/107,346, dated Jan. 13, 2012.

Partial International Search Report for PCT/US2008/061299 mailed on Jul. 24, 2008.

International Search Report and Written Opinion of the International Searching Authority a dated Aug. 11, 2008 for Intonational Application No. PCT/US2008/065421, 8 pages.

U.S. Appl. No. 60/940,953, entitled "Feedforward/Feedback Litho Process Control of Stress and Overlay", filed May 30, 2007.

D.K, Bowen, B.K, Tanner"High Resolution X-ray Diffractometry and Topography", (1998), CRCPress ISBN D-8506-6758-5), Chapter 1, pp. 1-13.

G. Turrell and J. Corset (Eds.), Raman Microscopt, pp. 275-277 (1996) Academic Press, ISBN 0-12-189690-0).

Neal T. Sullivan, "Semiconductor Pattern Overlay". Handbook of Critical Dimensions Metrology and Process Control, pp. 160-188, vol. CR52. SPIE Press (1993).

Gary Zhang et al., "Across Wafer Focus Mapping and Its Applications inAdvanced Technology Nodes", Optical Mlcrollthography XIX. edited by Donis G. Flagello, Proc. of SPIE, vol. 6154,10pages.

Non-Final Office Action mailed date Mar. 16, 2011 issued for U.S. Appl. No. 12/130,699, filed May 30, 2008, entitled"Feedforward/Feedback Litho Process Control of Stress and Overlay".

Japanese Office Action dispatch date : Aug. 28, 2012 for Japanese Patent application No. 2010-510538.

FEEDFORWARD/FEEDBACK LITHO PROCESS CONTROL OF STRESS AND OVERLAY

CLAIM OF PRIORITY

This application claims the benefit of priority of commonly-assigned U.S. Provisional Patent Application No. 60/940,953, filed May 30, 2007, the entire contents of which are incorporated herein by reference.

This application is a continuation of and claims the benefit of priority of commonly-assigned co-pending U.S. patent application Ser. No. 12/130,699, filed May 30, 2008, the entire contents of which are incorporated herein by reference.

FIELD OF THE INVENTION

This invention generally relates to substrate processing and more particularly to process control in a lithographic process.

BACKGROUND OF THE INVENTION

Various methods of measuring the stress in films deposited on semiconductor wafers are known in the art. Most commonly, the measurement is performed by measuring the shape of the wafer before a process step and then repeating the shape measurement after the process step. The stress of a film deposited (or removed) during the process step is calculated from the change in shape of the wafer and the known elastic modulus of the semiconductor material comprising the bulk of the wafer. The thickness of the wafer and/or film may be known prior to the shape measurement, or may be measured by the same apparatus making the shape measurement. If the stress and film thickness are reasonably uniform across the wafer and if the change in shape of the wafer is not large compared with the thickness of the wafer (all of which conditions are usually satisfied by most semiconductor manufacturing process steps), then Stoney's equation (G. G. Stoney (1909) Proc. Roy. Soc. A82, 172) may be used to calculate the film stress from the change in wafer curvature deduced from the change in wafer shape.

U.S. Pat. Nos. 5,134,303 and 5,248,889 (Blech et al) disclose a technique for scanning laser beams along a diameter of a wafer in order to measure the slope, and hence, curvature of the wafer. It will be understood by those of ordinary skill in the art that either the beam may be scanned across the wafer or the wafer may be moved under the beam in order to perform the measurement. If the stress of the film is uniform, measurement of a single diameter usually suffices. If the stress of the film is non-uniform, measurement of multiple diameters is often needed to build up a more complete picture of the wafer curvature.

U.S. Pat. No. 5,912,738 to Chason et al. describes a technique that uses multiple laser beams to make simultaneous measurements of slope at multiple locations on a wafer, thus speeding up the measurement by reducing, or eliminating, the need for relative scanning of the beam and wafer.

U.S. Pat. No. 6,031,611 to Rostakis et al. describes a technique that is capable of measuring slope (in one direction) simultaneously at many points across the whole surface of a wafer. A second measurement can be made with the wafer rotated by 90° in order to measure the other tilt component if that is also desired.

As an alternative to measuring the tilt of the wafer, it is also possible to measure the displacement of the wafer as a function of position across the wafer. U.S. Pat. No. 4,750,141 to Judell et al. discloses such a technique. The displacement measurement may be done with capacitive sensors (as disclosed in '141) or by optical or other means. U.S. Pat. No. 6,100,977 to Muller and U.S. Pat. No. 6,847,458 to Freischlad et al. disclose techniques that are capable of essentially simultaneously measuring the displacement of both sides of the of wafer using optical interferometers.

Other methods of measuring stress are known in the art. These other methods are generally less convenient for use in a production environment than the change in wafer shape metrology just described because these other techniques are generally slower or require more expensive hardware.

High resolution X-ray diffraction can measure the strain of the lattice of the semiconductor comprising the bulk of the wafer (see, for example, "High Resolution X-ray Diffractometerty and Topography" D. K. Bowen, B. K. Tanner (1998), CRC Press ISBN 0-8506-6758-5), Chapter 1, pp. 1-13, which is incorporated herein by reference. Since the elastic properties of common semiconductor materials are well known, a measurement of strain can be used to compute stress. Since the measurement of lattice constants depends only on the knowledge of the wavelength of the X-rays and of the angles of incidence and reflection of the X-rays, very accurate measurements of strain can be made by X-ray diffraction. But the slowness of the measurement and the complexity of the apparatus make this more suitable for use as a reference technique than as a routine production metrology technique that needs to measure tens or hundreds of wafers per day. Raman spectroscopy can measure semiconductor lattice strain because the shift of the Raman line depends on the strain of the semiconductor (see, e.g., "Raman Microscopy", G. Turrell and J. Corset (Eds.), pp. 275-277 (1996) Academic Press, ISBN 0-12-189690-0). This will work only of the overlying films on the wafer do not interfere with the Raman lines from the underlying material. The apparatus for Raman spectroscopy is complex compared with that for shape measurement, and the sensitivity and signal-to-noise ratio are poor because the Raman lines in semiconductors are so weak relative to the incident laser line. For all of these reasons Raman is not suitable for routine production measurements.

With respect to overlay metrology, extensive prior art can be found describing many different optical, algorithm and mark architectures which are relied on for this purpose. The current state of the art is, for example, the KLA-Tencor Archer 100 overlay metrology tool, which operates on the principle of high resolution bright field imaging of either box-in-box or periodic (AIM) two-layer metrology structures. With a box-in-box structure, the displacement between the centers of symmetry of two or more features, sequentially generated in a number of patterning steps is calculated by image processing of images acquired through a microscope and stored digitally. This technique further described and analyzed by Neal T. Sullivan, "Semiconductor Pattern Overlay", in Handbook of Critical Dimensions Metrology and Process Control, pp. 160-188, vol. CR52, SPIE Press (1993). Variations on such box-in-box structures are also described in U.S. Pat. Nos. 6,118,185 and 6,130,750, the disclosures of both of which are incorporated herein by reference.

A known alternative to the box-in-box technique is known as scatterometry overlay. In this technique, information is extracted from the intensity of light reflected from a periodic overlay mark. The overlay mark consists of gratings printed over gratings in subsequent patterning steps. In this approach, several overlay cells, with different intentional offsets between the two gratings of each cell, are formed in close proximity. The difference between the intensities of light scattered from these overlay marks allows a model-free determination of the overlay error. Such grating style targets (sometimes referred to as "AIM" marks) can be denser and more robust, than "box" or ring-type marks resulting in the collection of more process information, as well as target structures that can better withstand the rigors of CMP. The use of such marks is described, e.g., by Adel et al in commonly assigned U.S. Pat. Nos. 6,023,338, 6,921,916 and 6,985,618, all three of which are incorporated herein by reference for all purposes.

As the depth of focus and overlay control required for the smallest dimensions printed on the wafer shrink, simply controlling global wafer stress below some threshold is no longer sufficient. In particular, the rapid thermal annealing (sometimes referred to as spike anneal) needed to anneal semiconductor wafers after certain implant process steps has to heat and cool the wafer very rapidly in order to minimize the time spent at high temperatures to limit diffusion of implanted atoms. This fast heating and cooling subjects the wafer to significant stresses as different parts of the wafer heat and cool at different rates. Some of these stresses may remain "frozen in" after the wafer has cooled. Laser spike anneal uses a laser to rapidly heat the wafer in an attempt to achieve very high surface temperatures in a very short time. However, the laser is typically not powerful enough to heat the whole surface simultaneously. Instead, sections or strips are annealed one at a time eventually covering the whole wafer surface. Because only a part of the wafer is at high temperature at any one time, very high stresses can be generated and some of these stresses remain after processing. Non-uniform stresses in a wafer can distort the local shape of the wafer in complex ways. For example, the wafer may bend both in-plane and out of plane as a result of non-uniform stresses.

The manufacture of modern integrated circuit chips requires very many different patterns to be layered one on another. Each new pattern has to be accurately registered with patterns already on the chip. The patterning tool (e.g., a scanner or stepper) that prints the pattern on the wafer contains subsystems that measure the location, height and tilt of the existing pattern. The time available to make these measurements is limited because these measurements have to be done while the previous wafer is being exposed (or otherwise processed). Consequently, the number of measurements that can be made during such time is limited.

If the stress changes between one patterning step and the next, the shape of the wafer in X, Y and Z can change. If the change in stress is uniform then the shape changes can generally be represented accurately enough as linear distortions of the shape. In such a case, the measurements made by the patterning tool are often sufficiently accurate to correct for the distortions. However, if the changes in stress are non-uniform then the shape changes are complex and linear models may not be accurate enough.

Prior art lithography tools may attempt to make the wafer as flat as possible by using a vacuum chuck to suck the wafer down onto a very precisely machined flat surface. Typically, in order to minimize contact between the wafer backside and the chuck surface, the chuck uses a large number of pins to support the wafer. Because of the vacuum, a combination of atmospheric pressure and gravity forces the wafer down onto the pins and also causes some sag of the wafer between the pins, which are, by design, closely spaced to minimize the sag. The stresses in the wafer, the atmospheric pressure and force of gravity on the wafer and forces of the pins on the wafer where the wafer contacts a pin all interact to determine the shape of the wafer.

Wafer defocus of 50 nm may cause overlay shifts of approximately 10 nm. According to the 2005 ITRS roadmap, at the 32-nm node, the overall budget for overlay accuracy on critical layers is expected to be approximately 5.7 nm 3σ. A fraction of this amount (perhaps 50%) can be allocated to overlay caused by defocus. Based on these numbers, no more than about 15 nm of defocus could be tolerated at the 32-nm node. Without dynamic adjustment of focus and/or overlay, the wafer would be required to be flat to within to within ±15 nm within the area of the die in order to keep overlay registration within the required limits. Scanners do adjust the leveling of each individual die before printing, but the leveling only corrects for average slopes in the X and Y directions (e.g., a tilted wafer plane) and not for vertical distortions on scale lengths shorter than a die.

The complex distortions of the shape of the wafer in X, Y and possibly Z on the chuck due to the non-uniform changes in stress are not adequately accounted for by the patterning tool leading to regions of the wafer where yield is low due to poor alignment of one pattern with earlier patterns on chips in that area of the wafer.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Figure 1:
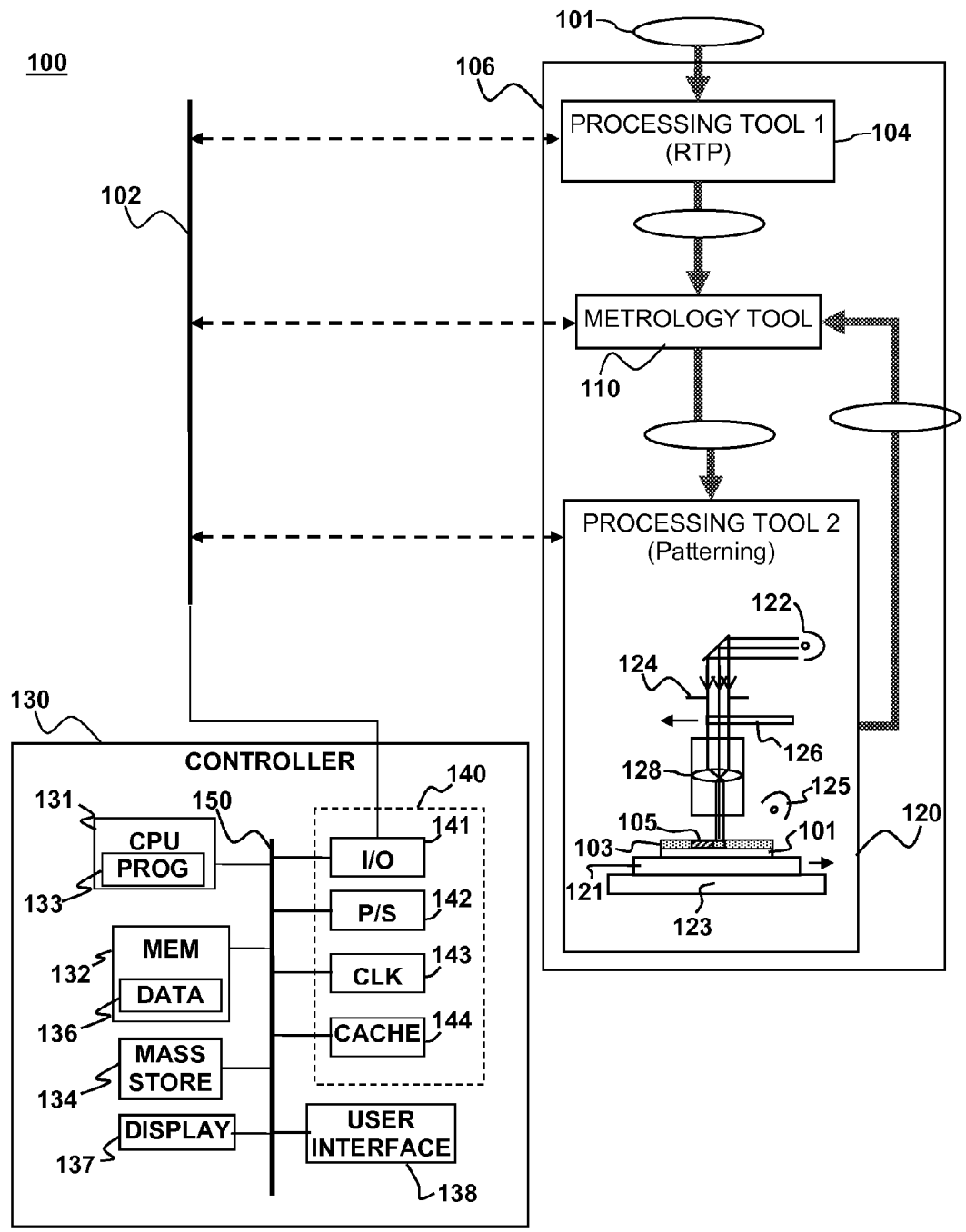
FIG. 1 is a block diagram of a semiconductor wafer processing system according to an embodiment of the present invention.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Embodiments of the present invention include a method and apparatus for process control in a lithographic process are described. Metrology may be performed on a substrate either before or after performing a lithographic patterning process on the substrate. One or more correctables to the lithographic patterning process may be generated based on the metrology. The lithographic patterning process performed on the substrate (or a subsequent substrate) may be adjusted with the correctables.

Embodiments of the present invention utilize various methods of stress, topography (shape) and overlay metrology in both feed-forward and feedback control loops with patterning, deposition and thermal processing tools in order to enhance die yield in semiconductor device manufacture. By automatically adjusting the patterning step to compensate for variations in prior processing steps, the maximum yield may be obtained from each wafer even when the stress from a given process changes over time or is non-uniform across the wafer. Unlike the prior art, embodiments of the present invention utilize direct feedback or feed forward of high order wafer and field level stress or topography metrology data as a means of controlling patterning, deposition and thermal processing tools. The prior art, by contrast, relied on keeping a global (or wafer average) stress introduced at each process step below some (process-specific) predetermined control limit in order to maintain the overall stress level. Just measuring a global or average stress value cannot reliably catch all local deviations in stress since a large stress in a small area may have only a small effect on the global stress, or large positive and negative local stresses in different areas may partially cancel each other out leading to low average stress. Furthermore since the distortions at any location on the wafer are the result of the net effect of all the prior processing steps, tight control limits may need to be imposed on each individual step to avoid cumulative effects at some wafer location causing unacceptable distortions. Imposing a low global stress control limit on a process step in order to avoid stress accumulating over multiple steps as well as to ensure a reduced probability of local stress exceeding some threshold may result in a more expensive and less efficient manufacturing process. Low control limits may require frequent adjustments to the process tools in order to keep them within that limit resulting in a less time available on the process tool for processing wafers and hence low productivity or the a need to purchase more processes tools than otherwise necessary to compensate for the reduced productivity.

FIG. 1 illustrates an apparatus 100 that according to an embodiment of the present invention. The apparatus 100 includes one or more semiconductor processing tools 104, 120, a metrology tool 110 and a controller 130. Two or more of the processing tools 104, 120 and metrology tool 110 may reside in a common chamber 106. Substrates 101 undergo fabrication-related processing in the processing tools 104, 120. The substrates may be transferred among the processing tools 104, 120 and metrology tool 110, e.g., using wafer handling robots or automated materials handling system or some combination of both. By way of example, the substrates may be semiconductor wafers or reticles. As used herein, a reticle refers to a mask (also known as a photomask) used in photolithography. The metrology tool 110 analyzes the substrates 101 before and/or after such processing. The controller 130 may use information from the processing tools 104, 120 and metrology tool 110 to provide feedback or feed-forward control of the processing tools. The processing tools 104, 120, metrology tool 110 and controller 130 may communicate with each other through a data bus 102.

By way of example, and without limitation of embodiments of the invention, the metrology tool 110 may include an overlay tool, a thin film tool, such as a spectroscopic ellipsometer, an electron beam tool such as a critical dimension scanning electron microscope (CD-SEM), or scatterometry tool. By way of example, and without loss of generality, the metrology tool 110 may be a thin film metrology tool. Examples of such tools include optical thin film metrology tools, such as ellipsometer-, scatterometer- and interferometer-based tools. Alternatively, the metrology tool 110 may be based on electric sensors such as capacitive sensors that can measure variations in substrate height. By way of example, and without loss of generality, the metrology tool may be an optical thin film metrology system based on spectroscopic ellipsometry. An example of such a tool is a Spectra Fx 200 optical thin film metrology system from KLA-Tencor Corporation of San Jose, Calif. Such systems generally include a focus sensor that may be used to measure changes in the shape of a substrate 101 due to processes occurring in the processing tools 104, 120.

The processing tools 104, 120 generally include a lithographic patterning tool 120 such as a scanner or stepper developer. Such developers are similar in operation to a slide projector or a photographic enlarger. Such tools are often used in photolithographic processes used to form microscopic circuit elements on the surface of a semiconductor wafer. In the pattering tool, the substrate is retained on a stage 121, which may include a chuck, e.g., a vacuum chuck or an electrostatic chuck. Elements of a circuit or other component to be created on the IC are reproduced in a pattern of transparent and opaque areas on the surface of a photomask or reticle 126. The pattern on the reticle 126 often corresponds to a pattern for a single die or chip. Light from a source 122 passes through the reticle 126, forming an image of the reticle pattern. The image is focused and reduced by a lens 128, and projected onto the surface of a substrate 101 that is coated with a photoresist 103. The focused image on the resist 103 is often referred to as an exposure field 105. After exposure, the coated substrate 101 may be chemically developed, causing the photoresist 103 to dissolve in certain areas according to the amount of light the areas received during exposure. This transfers the pattern on the reticle 126 to the resist 103. The patterning tool 120 may be equipped with heater elements 125, such as heat lamps, to facilitate heating of the resist 103 either before or after exposure, e.g., to harden it. The patterning tool 120 may be a stepper with an alignment system 123 that moves the substrate 101 after exposing one die so that another portion of the substrate 101 may be exposed with the same exposure field 103. The patterning tool 120 may also be configured as a scanner. Scanners are steppers that increase the length of the exposure field 103 by moving the reticle 126 and stage 121 in opposite directions to each other during the exposure. Instead of exposing the entire field at once, the exposure is made through an "exposure slit" 124 that is as wide as the exposure field 105, but only a fraction of its length (e.g., a 9×25 mm slit for a 35×25 mm field). The image from the exposure slit 124 is scanned across the exposure area on the substrate 101.

The substrate 101 with the developed resist 103 may then be subject to further processing, e.g., etching or deposition. Such processes may take place in other processing tools 104. Such tools may include spin-coaters, which deposit the resist on the substrate 101 or pre-bake chambers, in which the resist is heated prior to exposure or developing in the patterning tool 120. In addition, the other tool 104 may include a deposition tool, an etch tool, an ion implant tool, a resist application tool, a resist stripping tool, or a chemical mechanical planarization (CMP) tool. The substrate 101 may then be cleaned, recoated with photoresist, then passed through the patterning tool 120 again in a process that creates the circuit on the substrate 101 layer by layer.

The controller 130 may include a central processor unit (CPU) 131 and a memory 132 (e.g., RAM, DRAM, ROM, and the like). The CPU 131 may execute a process-control program 133, portions of which may be stored in the memory 132. The memory may contain data 136 related to processes occurring in the tools 104, 120 and/or metrology performed by the metrology tool 110 on one or more substrates 101. The controller 130 may also include well-known support circuits 140, such as input/output (I/O) circuits 141, power supplies (P/S) 142, a clock (CLK) 143 and cache 144. The controller 130 may optionally include a mass storage device 134 such as a disk drive, CD-ROM drive, tape drive, or the like to store programs and/or data. The controller 130 may also optionally include a display unit 137 and user interface unit 138 to facilitate interaction between the controller 130 and a user. The display unit 137 may be in the form of a cathode ray tube (CRT) or flat panel screen that displays text, numerals, or graphical symbols. The user interface 138 may include a keyboard, mouse, joystick, light pen or other device. The preceding components may exchange signals with each other via an internal system bus 150. The controller 130 may be a general purpose computer that becomes a special purpose computer when running code that implements embodiments of the present invention as described herein.

By way of example, the program 133 may implement a process control loop in which stress and/or shape and/or overlay metrology data, acquired at a high spatial density across the substrate 101 is used to calculate corrections to the process taking place in the tools 104, 120 by various modeling methods. Such corrections may subsequently be used to implement high order overlay and focus corrections to the patterning process. In this way, the patterning process is enabled as a tool to compensate for deformations induced in process steps prior to patterning. This is different from the existing state of the art, since in current patterning tools, there are severe constraints on the time available to perform metrology activities on the wafer in preparation for the patterning step. Due to these time constraints, in situ-metrology does not currently perform high density sampling of stress and deformation metrology, in order to enable high order focus and overlay compensation during the subsequent patterning step.

Figure 2:
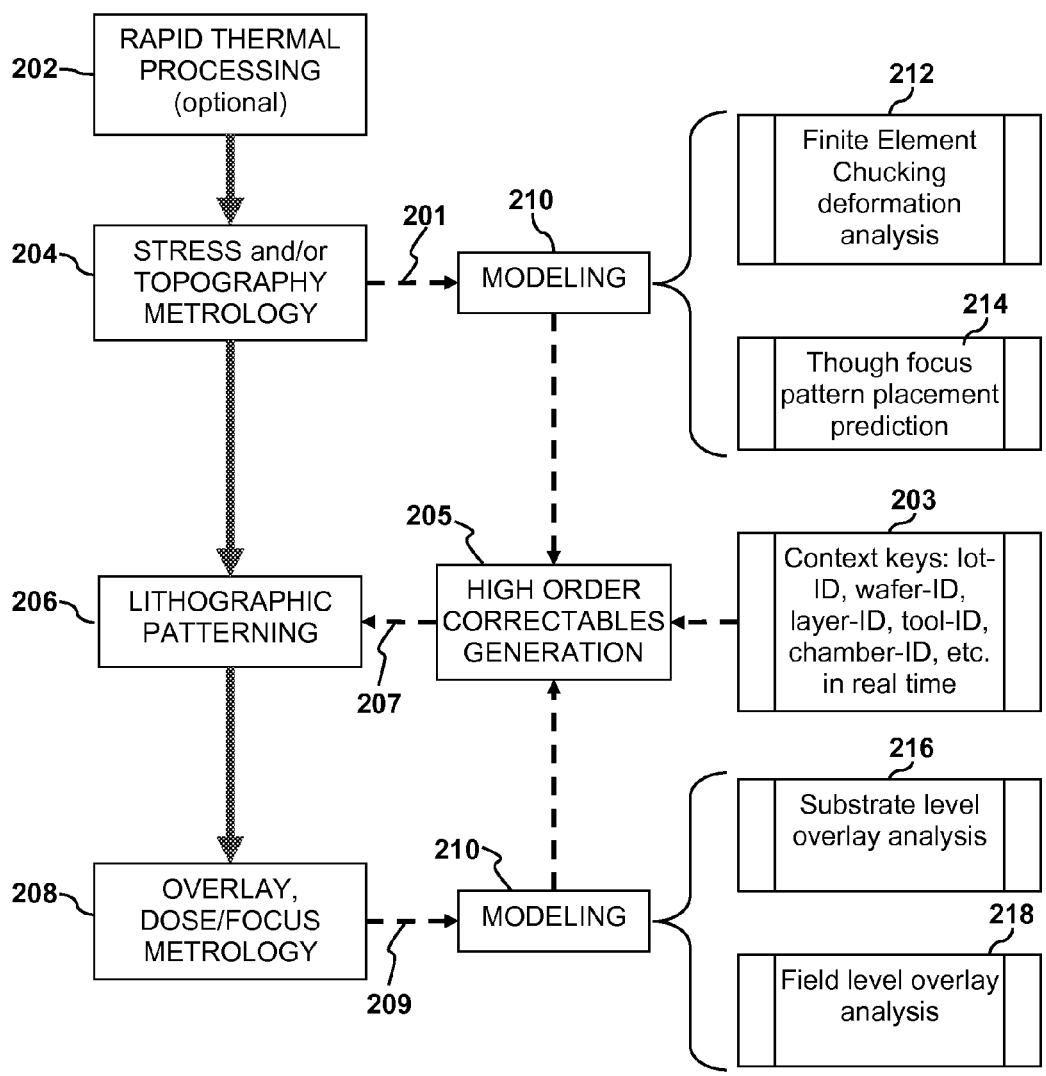
FIG. 2 is a flow diagram illustrating a method of process control in semiconductor wafer processing according to an embodiment of the present invention.

As illustrated in FIG. 2, the program 133 may implement a method 200 for process control in a lithographic process. In FIG. 2, vertical dashed arrows indicate flow of wafers, horizontal dashed arrows indicate flow of data, and solid arrows indicate flow of substrates 101. According to the method 200, substrates 101 transition from the processing tool 104, which may induce stress or deformation into the metrology tool 110. By way of example, a heating process, such as rapid thermal processing (RTP) may optionally take place in the processing tool 104 as indicated at 202. Stress and deformation metrology may then be performed in the metrology tool 110, as indicated at 204. Specifically, the metrology tool may measure the topography (e.g., thickness) of or stress at one or more locations in one or more layers of material (e.g., thin films) formed on the substrate 101. Metrology data 201 obtained at 204 may be used as input for a modeling module 210, which may be implemented as part of the program 133. Alternatively, the modeling module 210 may be implemented wholly or partly in hardware. By way of example, the modeling module 210 may perform finite element chucking deformation analysis 212, which calculates the predicted shape deformation (in three dimensions) of the wafer when chucked on the stage 121 of the patterning tool 120. The chucking deformation analysis 212 may be based on metrology data measuring the deformation of a test substrate that is sufficiently similar to the substrate 101. The test substrate may undergo processing in the patterning tool 120 with a test pattern on the reticle 126 while the test substrate is chucked to the stage 121. The metrology tool 110 may then obtain deformation data on the test substrate. In addition, the modeling module 210 may perform a simulation of the impact of this deformation on the pattern generated during a subsequent patterning step in the patterning tool 120. The impact of the deformation on the pattern may be in the form of a through-focus pattern placement prediction 214, which may be determined based on known characteristics of the patterning process such as lithography system field dependent non-telecentric imaging.

Deformation data may then be input to a correctables generation engine 205, which may be implemented as part of the program 133. Alternatively, the correctables generation engine 205 may be implemented wholly or partly in hardware. The correctables generation engine 205 may convert the results of the modeling module 210 to the coordinate system of the patterning tool 120. The correctables generation engine 205 may also take as input, overlay, dose and focus data, as well as feedback from metrology data from previous substrates 101 or previous substrate lots. The correctables generation engine 205 may also receive relevant context data 203 such as substrate-ID lot-ID, substrate-ID, layer-ID, tool-ID, chamber-ID, or chuck-ID in real time. The context data 203 may be highly useful for the correctables generation engine 205 since these various context keys may all impact the processing taking place in the patterning tool. The substrate 101 is then patterned, as indicated at 206, after high order wafer and field level corrections have been applied, e.g., to overlay and/or focus patterning system controls within the patterning tool 120. The patterning process at 206 may include exposure of the resist 103 followed by baking to harden the resist. By way of example, the patterning tool 120 may be characterized by a number of parameters between the reticle. The correctables generation engine 205 may feed forward adjustments to one or more of these parameters to the patterning tool 120 as correctables 207. By way of example, and without limitation, the correctables 207 may include adjustments to any of the parameters used in computing an amount of overlay error dx, dy in the x and y directions at a location Xf, Yf within a field having a center at 0,0. The relevant parameters may differ depending on the patterning tool 120 and computational method used. For a scanner tool, a method referred to as an X and Y method, may be used to compute the quantities dx and dy as follows:

$$dx = \text{FieldOffset}X + (\text{FieldMag}X \times Xf) + (\text{FieldRot}X \times -Yf)$$

$$dy = \text{FieldOffset}Y + (\text{FieldMag}Y \times Yf) + (\text{FieldRot}Y \times Xf),$$

where:

FieldOffsetX and FieldOffsetY refer to field offsets in the x and y directions;
FieldMagX and FieldMagY refer to field magnifications in the x and y directions; and
FieldRotX and FieldRotY refer to field rotations with respect to the x and y directions;

For scanner tool, an alternative method, referred to as a symmetrical/asymmetrical method, may be used to compute dx and dy by:

$$dx = \text{FieldOffset}X + (\text{FieldMag} \times Xf) + (\text{FieldRot} \times -Yf) + (\text{AsymFieldMag} \times Xf) + (\text{AsymFieldRot} \times -Yf); \text{ and}$$

$$dy = \text{FieldOffset}Y + (\text{FieldMag} \times Yf) + (\text{FieldRot} \times Xf) + (\text{AsymFieldMag} \times -Yf) + (\text{AsymFieldRot} \times -Xf),$$

where AsymFieldMag refers to an asymmetrical field magnification and AsymFieldRot refers to an asymmetrical field rotation.

For a stepper tool, dx and dy may be computed as:

$$dx = \text{FieldOffset}X + (\text{FieldMag} \times Xf) + (\text{FieldRot} \times -Yf); \text{ and}$$

$$dy = \text{FieldOffset}Y + (\text{FieldMag} \times Yf) + (\text{FieldRot} \times Xf).$$

Specifically, the correctables 207 may include adjustments to FieldOffsetX, FieldOffsetY, Field MagX, FieldMagY, FieldRotX, FieldRotY, AsymFieldMag and AsymFieldRot.

After patterning, overlay focus the substrate 101 may be sent to the metrology tool 110 (or a different metrology tool) where post patterning metrology (e.g., dose and/or overlay metrology) may be performed on the substrate 101 as indicated at 208. Post patterning metrology data 209 may be used to provide feedback to the patterning tool 120 for patterning of a subsequent substrate or lot. For example, the post patterning metrology data 209 may be input to the modeling module 210 which may apply substrate level overlay analysis 216 and/or field level overlay analysis 218 to the post patterning metrology data 209. The results of such analysis may then be fed back to the correctables generation engine 205.

In embodiments of the present invention, the metrology tool 110 may measure wafer stress and/or topography at critical process steps with more detail (spatial resolution) than is current practice. As discussed above, the typical prior art practice is only to monitor a wafer average stress. In embodiments of the present invention, by contrast, wafer stress may be monitored at a resolution of one, or a few, mm (e.g., about one millimeter to about five millimeters) as required to make an accurate prediction of the interaction with the chuck. These more detailed measurements are combined with models of how these stresses or shape changes interact with the patterning tool wafer chuck in order to feed high-order correctables 207 to the patterning tool 120. As a result, the patterning tool can make real-time adjustments during scanning in order to produce better registration between the printed pattern and prior patterns on the substrate 101. No such modeling or feed-forward scheme is used in prior art wafer processing systems.

Any suitable technique for measuring substrate stress or substrate shape may be used at 204 and/or 208 as long as the technique is adapted to provide sufficiently high spatial resolution. Any of the prior art techniques for measuring overlay error may be used. Critical dimension (CD) measurements may be used in conjunction with the overlay measurements in order to measure how much focus has changed. The correctables generation engine 205 may generate the correctables 207 based on a theoretical model of how the wafer stress and/or shape interact with the chuck or may be based entirely on empirical correlations between overlay measurements and stress/shape measurements or on a combination of the two. The model may be created once for a specific patterning tool 120, or the correctables engine 205 and/or modeling module 210 may constantly and automatically update the model as post pattering overlay measurement results 209 are accumulated.

In embodiments of the present invention, some or all of the substrates 101 processed by the patterning tool 120 may be measured by the metrology tool 110. For example, 100% of the substrates 101 may be measured for stress and/or shape after a critical processing step and 100% of the substrates may be measured for overlay errors after patterning. Alternatively, only selected subsets of the substrates 101 may be measured by the metrology tool 110 both before and after patterning. If a single process tool (or single process chamber on a specific tool) has a repeatable signature of substrate distortion, it may be sufficient to measure one substrate per lot from that tool (or chamber) or one wafer per several lots for either the stress and/or shape or the overlay measurement (or both). In some cases, a tool may have more than one chuck and each chuck may have a different signature. The signature, e.g., measurements taken on substrates processed with the particular tool, chamber, chuck, etc. (or modeling analysis based on these measurements) may be stored in the memory 132. The signature may be retrieved and selectively fed into the correctables generation engine 205 based on context data 203, such as a tool-ID or chamber-ID associated with the substrate 101.

Figure 3:
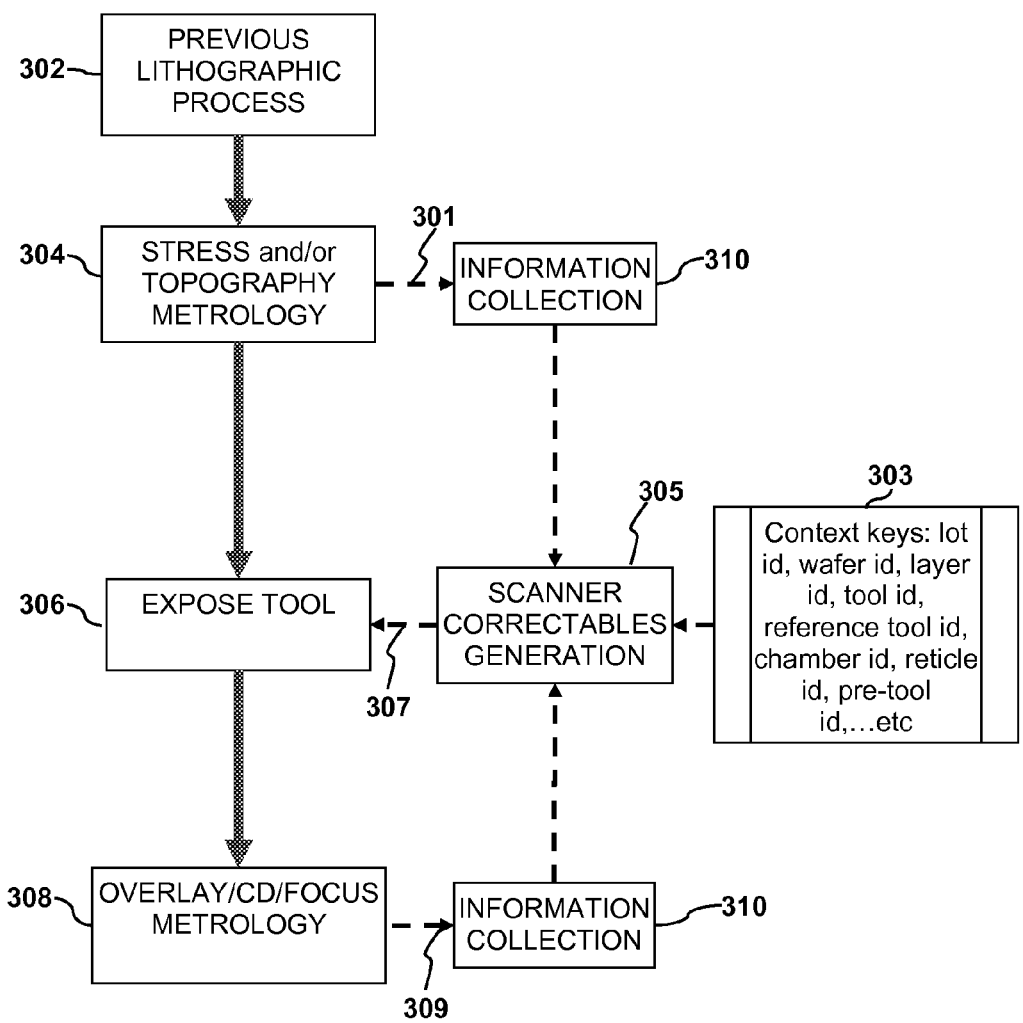
FIG. 3 is a flow diagram illustrating a method of process control in semiconductor wafer processing according to an alternative embodiment of the present invention.

As illustrated in FIG. 3, the program 133 may implement an alternative method 300 for process control in a lithographic process. In FIG. 3, vertical dashed arrows indicate flow of wafers, horizontal dashed arrows indicate flow of data, and solid arrows indicate flow of substrates 101.

According to the method 300, substrates 101 transition to the metrology tool 110 from a previous lithographic process 302. The previous lithographic process 302 may involve any lithographic step, e.g., resist application, resist exposure, resist developing, resist stripping, rapid thermal processing, material deposition, etching, thermal oxidation, ion implantation, and the like. Stress and/or topography metrology may then be performed in the metrology tool 110, as indicated at 304. Specifically, the metrology tool 110 may measure the topography (e.g., thickness) of or stress at one or more locations in one or more layers of material (e.g., thin films) formed on the substrate 101. Metrology data 301 may be analyzed at 306 to obtain information about film stress or topography of the substrate 101.

After metrology at 304, the substrate 101 is sent to the lithographic patterning tool 120, e.g., for resist exposure and or developing. After processing with the patterning tool 120, the substrate 101 may be sent to the metrology tool 110 (or a different metrology tool) for post processing metrology 308. Such post processing metrology may include overlay metrology, critical dimension (CD) metrology, focus metrology or some combination of two or more of these.

Information collected at 306 may provide feed forward to a scanner correctables generation engine 305, which may be implemented as part of the program 133. Alternatively, the scanner correctables generation engine 305 may be implemented wholly or partly in hardware. The scanner correctables generation engine 305 may convert metrology information collected at 306 to the coordinate system of the patterning tool 120. The correctables generation engine 305 may also take as input, overlay, dose and focus data, as well as feedback information collected at 310 from post-processing metrology data 309 from the post-processing metrology 308. The correctables generation engine 305 may also receive relevant context data 303 such as substrate-ID lot-ID, substrate-ID, layer-ID, tool-ID, chamber-ID, reference tool-ID, reticle-ID, pre-tool-ID, chuck-ID, and the like in real time. The context data 303 may be highly useful for the correctables generation engine 205 since these various context keys may all impact the processing taking place in the patterning tool 120. The correctables generation engine 305 may feed forward adjustments to one or more patterning tool parameters to the patterning tool 120 as scanner correctables 307.

Various Methods are available for generating the scanner correctables 307. For example feed-forward information collected at 306 may be used to generate high-order grid correction, individual linear and/or high-order field-level corrections, focus corrections and the like. Feed-forward information collected at 306 may cover substrate shape-related overlay error. Such errors are often process related and may depend on the nature of the previous lithographic process 302, e.g., whether the previous process is a thermal process, etch process, CMP process . . . etc. In addition, feedback information collected at 310 may be used to generate high-order grid corrections, linear and/or high-order average of fields correction, linear and/or high-order individual field level corrections and the like.

The feedback information collected at 310 may cover exposure tool signatures such as stage, scanning, reticle stage, lens and illumination signatures, reticle signature, exposure tool matching signature, and remaining process related signatures.

Embodiments of the present invention can reduce patterning errors and improve yield for processes that require high precision and small design rules.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for process control in patterning a substrate, comprising:
   a) performing metrology on the substrate either before or after performing a patterning process on the substrate;
   b) generating one or more correctables to the patterning process based on the metrology performed in a) by performing an analysis of deformation of the substrate across the substrate at a spatial resolution of about 1 mm to about 5 mm; and either
   c) adjusting the patterning process performed on the substrate with the correctables, if the metrology is performed before the patterning process; or
   d) adjusting the patterning process performed on a subsequent substrate with the correctables, if the metrology is performed after the patterning process; or
   e) both c) and d).

2. The method of claim 1, wherein patterning process performed on the substrate with the correctables the metrology is performed before the patterning process and generating the one or more correctables includes performing an analysis of deformation of the substrate.

3. The method of claim 2, wherein adjusting the patterning process performed on the substrate with the correctables includes feeding the correctables forward to a patterning tool, adjusting one or more parameters of the patterning tool using the correctables and performing the patterning process on the substrate with the patterning tool.

4. The method of claim 2, wherein the correctables include adjustments to a field offset, a field magnification, or a field rotation of a lithographic patterning tool.

5. The method of claim 4 wherein the field magnification is an asymmetric field magnification.

6. The method of claim 4 wherein the field rotation is an asymmetric field rotation.

7. The method of claim 2 wherein performing an analysis of deformation of the substrate includes performing a through focus pattern placement prediction.

8. The method of claim 2 wherein performing metrology includes performing stress and/or topography metrology for one or more layers of material on the substrate.

9. The method of claim 2 wherein performing an analysis of deformation of the substrate includes predicting shape deformation.

10. The method of claim 2 wherein performing an analysis of deformation of the substrate includes monitoring a localized stress of the substrate at a plurality of locations.

11. The method of claim 10 wherein monitoring a localized stress includes monitoring the localized stress at a spatial resolution of between about 1 mm and about 5 mm.

12. The method of claim 1 wherein a) includes performing stress and/or topography metrology before performing the patterning process.

13. The method of claim 12 wherein a) includes performing overlay, critical dimension or focus metrology after performing the patterning process.

14. The method of claim 1 wherein a) includes performing stress and/or topography metrology before performing the patterning process and after a previous process.

15. The method of claim 14 wherein a) includes performing overlay, critical dimension or focus metrology after performing the patterning process.

16. The method of claim 1 wherein generating the one or more correctables includes the use of context data associated with the processing of the substrate.

17. The method of claim 16 wherein the context data includes a lot-ID, substrate-ID, layer-ID, tool-ID, chamber-ID, scanner-ID, or chuck-ID, reference tool-ID, reticle-ID or pre-tool-ID associated with processing of the substrate.

18. The method of claim 1 wherein the patterning process comprises an exposure step, a bake step and a develop step.

19. The method of claim 1 wherein the metrology is performed after the patterning process.

20. The method of claim 19 wherein performing metrology on the substrate includes performing overlay, dose, or focus metrology on the substrate.

21. The method of claim 20 wherein the correctables include adjustments to a field offset, a field magnification, or a field rotation of a patterning tool.

22. The method of claim 21 wherein the field magnification is an asymmetric field magnification.

23. The method of claim 21 wherein the field rotation is an asymmetric field rotation.

24. The method of claim 20 wherein generating the one or more correctables includes performing an overlay analysis.

25. The method of claim 24 wherein the overlay analysis is a substrate level overlay analysis or a field level overlay analysis.

26. The method of claim 1 wherein generating the correctables includes modeling an interaction between the substrate and a chuck used to retain the substrate during the patterning process to obtain a shape of the substrate when retained by the chuck.

27. The method of claim 26, further comprising converting the shape of the substrate when retained by the chuck to a coordinate system for a patterning tool used during the patterning process.

28. An apparatus for process control in patterning a substrate, comprising:
   a metrology tool adapted to perform metrology on the substrate either before or after performing a patterning process on the substrate; and
   a controller coupled to the metrology tool, wherein the controller is adapted to generate one or more correctables to the patterning process based on the metrology by performing an analysis of deformation of the substrate across the substrate at a spatial resolution of about 1 mm to about 5 mm and either:
      a) adjust the patterning process performed on the substrate with the correctables, if the metrology is performed before the patterning process; or
      b) adjust the patterning process performed on a subsequent substrate with the correctables, if the metrology is performed after the patterning process; or
      c) both a) and b).

29. The Apparatus of claim 28, wherein adjusting the patterning process performed on the substrate with the correctables includes feeding the correctables forward to a patterning tool.

30. The apparatus of claim 28 wherein the metrology tool is a thin film metrology system.

31. The apparatus of claim 28 wherein the metrology system is an optical thin film metrology system.

32. The apparatus of claim 28 wherein the metrology system includes an interferometer adapted to measure height of one or more features on the substrate.

33. The apparatus of claim 28 wherein the metrology system includes one or more capacitive sensors adapted to measure height of one or more features on the substrate.

34. The apparatus of claim 28 wherein the controller includes modeling module and a correctables generation module.

35. The apparatus of claim 34 wherein the modeling module is configured to model an interaction between the substrate and a chuck used to retain the substrate during the patterning process to obtain a shape of the substrate when retained by the chuck.

36. The apparatus of claim 35 wherein the modeling module is configured to model the interaction by a finite element chucking deformation analysis that calculates a predicted shape deformation of the wafer when retained by the chuck.

37. The apparatus of claim 28 wherein the controller includes a correctables generation module configured to generate corrections to one or more parameters of a patterning tool in response to metrology data obtained from the metrology tool.

38. The apparatus of claim 37, further comprising, a patterning tool, wherein the patterning tool is coupled to the controller.

* * * * *